(12) United States Patent
Bernard et al.

(10) Patent No.: US 8,071,275 B2
(45) Date of Patent: Dec. 6, 2011

(54) METHODS FOR PLANARIZING UNEVENNESS ON SURFACE OF WAFER PHOTORESIST LAYER AND WAFERS PRODUCED BY THE METHODS

(75) Inventors: David Laurier Bernard, Lexington, KY (US); Paul William Dryer, Lexington, KY (US); Andrew Lee McNees, Lexington, KY (US)

(73) Assignee: Lexmark International, Inc., Lexington, KY (US)

( * ) Notice: Subject to any disclaimer, the term of this patent is extended or adjusted under 35 U.S.C. 154(b) by 851 days.

(21) Appl. No.: 12/100,716

(22) Filed: Apr. 10, 2008

(65) Prior Publication Data

US 2009/0258322 A1 Oct. 15, 2009

(51) Int. Cl.
*G03F 7/26* (2006.01)
(52) U.S. Cl. ........................................... 430/322
(58) Field of Classification Search .................. 430/313, 430/327, 5, 322
See application file for complete search history.

(56) References Cited

U.S. PATENT DOCUMENTS

| | | | |
|---|---|---|---|
| 5,310,623 A | 5/1994 | Gal | |
| 5,583,736 A | 12/1996 | Anderson et al. | |
| 6,635,412 B2 | 10/2003 | Afromowitz | |
| 7,271,104 B2 | 9/2007 | Bernard et al. | |
| 2006/0046497 A1* | 3/2006 | Teranishi | 438/735 |
| 2007/0004215 A1 | 1/2007 | Mrvos et al. | |

FOREIGN PATENT DOCUMENTS

WO  WO 0231600 A1  4/2002

OTHER PUBLICATIONS

C.M. Waits et al., "Microfabrication of 3D silicon MEMS structures using gray-scale lithography and deep reactive ion etching", Sensors and Actuators A, 119 (2005) 245-253.

* cited by examiner

*Primary Examiner* — Kathleen Duda
*Assistant Examiner* — Caleen Sullivan

(57) ABSTRACT

A wafer has a substrate and a photoresist layer thereon with a surface that is planarized by positioning over a starting surface of the photoresist layer a gray-scale mask having a pattern that correlates with a gradient height profile of unevenness present on the starting surface, patterning the photoresist layer using the gray-scale mask to produce the pattern thereof in the photoresist layer which, in effect, produces a profile of evenness in the photoresist layer underlying the gradient height profile of unevenness, and developing the patterned photoresist layer such that only a three-dimensional portion thereof corresponding to the gradient height profile of unevenness located above the profile of evenness is removed which, in effect, leaves behind a resulting surface on the photoresist layer made substantially more even and thus substantially in a planarized condition.

10 Claims, 3 Drawing Sheets

METHODS FOR PLANARIZING UNEVENNESS ON SURFACE OF WAFER PHOTORESIST LAYER AND WAFERS PRODUCED BY THE METHODS

CROSS REFERENCES TO RELATED APPLICATIONS

This patent application is related to the U.S. patent application Ser. No. 11/562,081, filed Nov. 21, 2006, entitled "Method And Apparatus For Maximizing Cooling For Wafer Processing" and assigned to the assignee of the present application.

BACKGROUND

1. Field of the Invention

The present invention relates generally to wafer processing methods and, more particularly, to a method for planarizing unevenness on a surface of a wafer photoresist layer and also to a wafer produced by the method 2. Description of the Related Art Micro-fluid ejection heads are useful for ejecting a variety of fluids including inks, cooling fluids, pharmaceuticals, lubricants and the like. One use of micro-fluid ejection heads is in an ink jet printer. Ink jet printers continue to be improved as the technology for making the micro-fluid ejection heads continues to advance. New techniques are constantly being developed to provide low cost, highly reliable printers which approach the speed and quality of laser printers. An added benefit of ink jet printers is that color images can be produced at a fraction of the cost of laser printers with as good or better quality than laser printers. All of the foregoing benefits exhibited by ink jet printers have also increased the competitiveness of suppliers to provide comparable printers in a more cost efficient manner than their competitors.

One area of improvement in the printers is in the micro-fluid ejection head itself. This seemingly simple device is a relatively complicated structure containing electrical circuits, ink passageways and a variety of tiny parts assembled with precision to provide a powerful, yet versatile micro-fluid ejection head. The components of the ejection head must cooperate with each other and with a variety of ink formulations to provide the desired print properties. Accordingly, it is important to match the ejection head components to the ink and the duty cycle demanded by the printer. Slight variations in production quality can have a tremendous influence on the product yield and resulting printer performance.

In order to improve the quality of the micro-fluid ejection heads, new techniques for fabricating components of the heads are being developed. For example, electrostatic chucks (ESC) are being used to hold a wafer during Deep Reactive Ion Etching (DRIE) and other wafer processing steps. See the U.S. patent application cross-referenced above as well as U.S. patent application publication no. 2007/0004215 to Mrvos et al. Both are assigned to the assignee of the present invention and their disclosures are hereby incorporated herein by reference. See also U.S. Pat. No. 6,628,500 to Thomas et al. DRIE is used in various ways including to form ink vias in the wafer to provide fluid to ejection actuator devices on a device surface of the wafer. However, DRIE generates heat that can adversely affect components of the micro-fluid ejection head, particularly organic photoresist layers on the ejection head substrate used as masking layers and/or etch stop layers.

The ESC generates a uniform electrostatic capacitively inducted force that clamps a wafer to a dielectric (ceramic plate) on an electrode of the ESC for supporting the wafer during the etching process. The etch stop constituted by a positive photoresist coating or layer formed on a back side of the wafer facing the ESC dielectric substrate prevents the etching from reaching the dielectric through the front side of the wafer. Due to the process used in forming it, the etch stop is typically an irregular or non-uniform film layer with a non-uniform edge bead provided about the perimeter of the layer.

Wafers need to be cooled during the etching process, either by convection or conduction techniques or a combination of both. A significant portion of the wafer clamping force and wafer cooling quality is due to a gap distance between the wafer and the dielectric. In the past, an ESC was used having a series of mesas on the front side of its dielectric to define a three dimensional space between it and the etch stop layer in order to create the necessary helium circuit for wafer cooling and to control the amount of area of direct electrical contact between the wafer and the ESC. See, for an example, U.S. Pat. No. 5,583,736 to Anderson et al. As long as the ESC used had mesas, the presence of the edge bead of the etch stop was found to be beneficial by contributing to enhanced cooling of the wafer through increasing the amount of surface area contacted by the helium as well as increased volume of helium used to remove heat at the edge of wafers where damage traditionally is incurred from wafer cooling varying negatively. However, significant non-uniformity of the edge bead is problematic for clamping uniformity and helium containment.

Recent improvements in ESC construction, namely the use of a thick higher purity dielectric ESC (hereinafter called an improved ESC), has improved clamping force and wafer cooling by improving, among other things, the thermal conductivity of the dielectric, the voltage across the dielectric, reducing the gap distance between the wafer and the dielectric, and changing the helium cooling circuit. Furthermore, the mesas have been eliminated from the dielectric and a single helium back side gas circuit has been provided at the edge of the underside of the wafer.

Where the irregular edge bead on the etch stop was beneficial to wafer cooling as long as mesas were provided on the ESC dielectric since the edge bead offset the negative effect on the clamping force quality of the mesas, with the mesas now eliminated the presence of the irregular edge bead now presents significant challenges to helium back side gas containment and wafer cooling in a system using the improved ESC dielectric. The recent improvement in ESC construction thus means that the presence of edge bead on the etch stop is no longer beneficial. The edge bead presence is now a problem for the DRIE etch process because it increases gap distance between the wafer and the improved ESC, negatively affecting both cooling and clamping of the wafer.

Thus, edge bead removal from the etch stop is now desired. However, employment of known mechanical and chemical removal methods on the edge bead exacerbate the problem. Both methods, though highly optimized using available equipment and knowledge, are fundamentally limited by the presence of a main flat feature on the wafer. This limitation causes positive resist features that make the efficient cooling of the wafer during the etch step more difficult. Current edge bead removal techniques present challenges from a process control standpoint because of this variation across the wafer between the main flat area and the rest thereof.

Thus, there is a need for an innovation that will be effective for planarizing a sacrificial photoresist layer, such as the etch stop with an edge bead, in order to maximize wafer clamping and cooling and thereby improve the quality of the polymer disposition and etch in a DRIE etch process.

SUMMARY OF THE INVENTION

The present invention meets this and other needs by using a technique of gray-scale lithography known heretofore per se but which has not been employed heretofore to planarize areas of unevenness, such as by removing a peripheral edge bead, from a surface of a photoresist etch stop layer on a wafer. The typical application of the gray-scale lithography technique used heretofore is to employ it in combination with a DRIE technique, first, to form a three-dimensional structure, by exposing a gray-scale mask pattern correlated with the profile of the structure, in a photoresist layer on a silicon substrate and, second, to transfer the profile of that three-dimensional structure, by developing the pattern in the photoresist layer followed by applying the DRIE technique, to the silicon substrate. See U.S. Pat. No. 5,310,623 to Gal.

Underlying the innovation of the present invention is the insight by the inventors herein that a peripheral edge bead can be removed from a photoresist edge stop by using the gray-scale lithography technique alone, and thus without use of the DRIE technique, to substantially planarize the surface of the etch stop without disturbance of the wafer substrate. While the use of this gray-scale lithography technique adds a process step and may require modifications to some current steps, the disadvantages of any such additions and modifications are more than offset by the substantial benefits that are gained, such as improved, more uniform and repeatable cooling, reduced ESC cleaning (the source of significant downtime), extended ESC life due to reduced cleanings, and improved DRIE uptime.

Accordingly, in an aspect of one embodiment of the present invention, a method for substantially planarizing a surface of a photoresist layer on a substrate of a wafer includes positioning over a starting surface of the photoresist layer a gray-scale mask having a pattern that correlates with a gradient height profile of unevenness present on the starting surface, patterning the photoresist layer by using the gray-scale mask to expose the pattern of the gray-scale mask in the photoresist layer which, in effect, produces a patterned profile of evenness in the photoresist layer underlying the gradient height profile of unevenness, and developing the exposed photoresist layer such that a three-dimensional portion thereof corresponding to the gradient height profile of unevenness located above the patterned profile of evenness is removed which, in effect, leaves behind a resulting surface of the photoresist layer made substantially more even and thus substantially in a planarized condition.

In another aspect of the present invention, a wafer includes a substrate and a photoresist layer thereon with a surface substantially planarized by the method of the present invention.

BRIEF DESCRIPTION OF THE DRAWINGS

Figure 1:
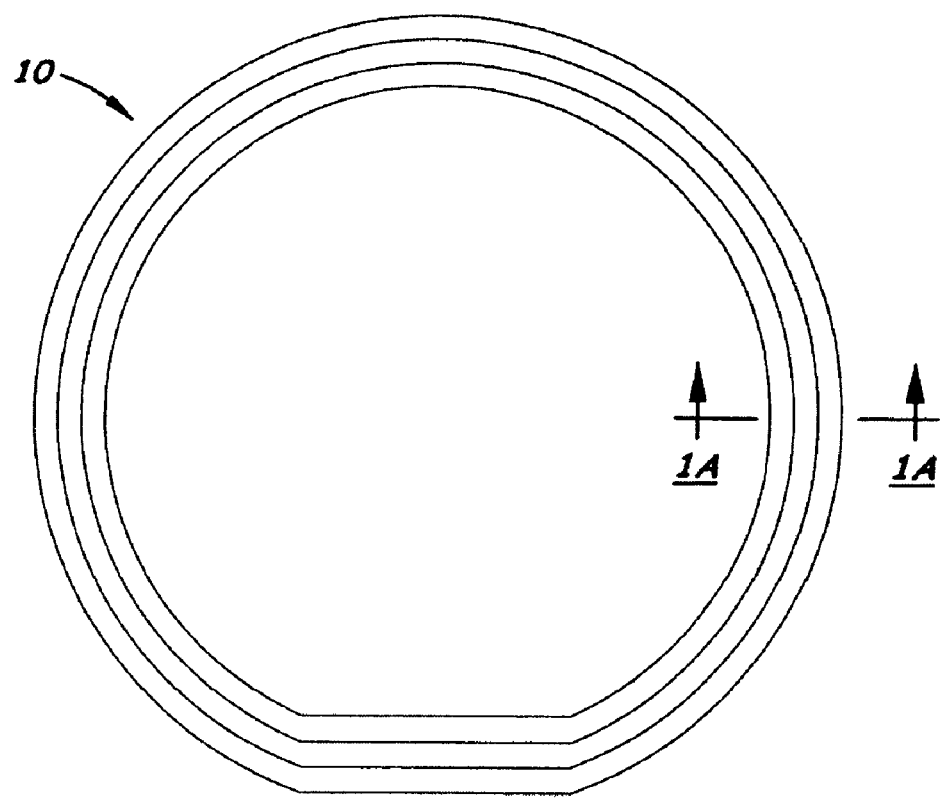

Having thus described the invention in general terms, reference will now be made to the accompanying drawings, which are not necessarily drawn to scale, and wherein:

FIG. 1 is a plan view of a gray-scale mask employed in the method of the present invention for substantially planarizing a surface of a photoresist layer on a substrate of a wafer.

Figure 1A:
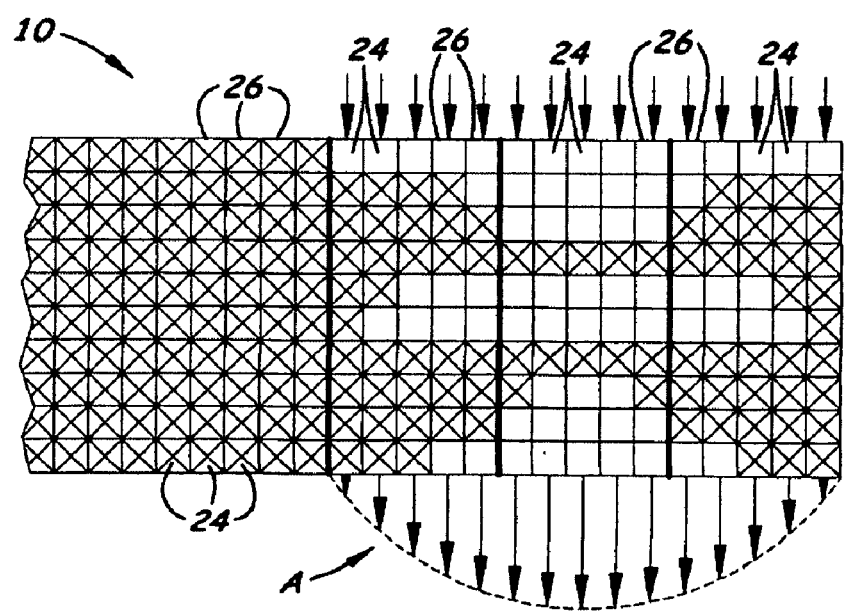

FIG. 1A is an enlarged fragmentary sectional symbolic view of the gray-scale mask as taken along line 1A-1A in FIG. 1, showing a pattern of light of varying intensity, as represented by arrows of varying lengths, transmitted through a segment of the gray-scale mask.

Figure 2:
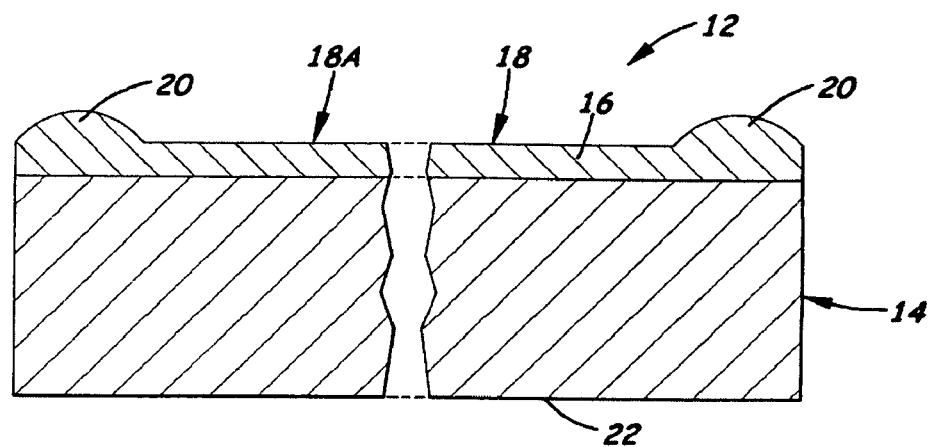

FIG. 2 is a schematic sectional representation of a photoresist etch stop layer on a substrate of a wafer having a peripheral edge bead on a back surface of the etch stop layer.

Figure 3:
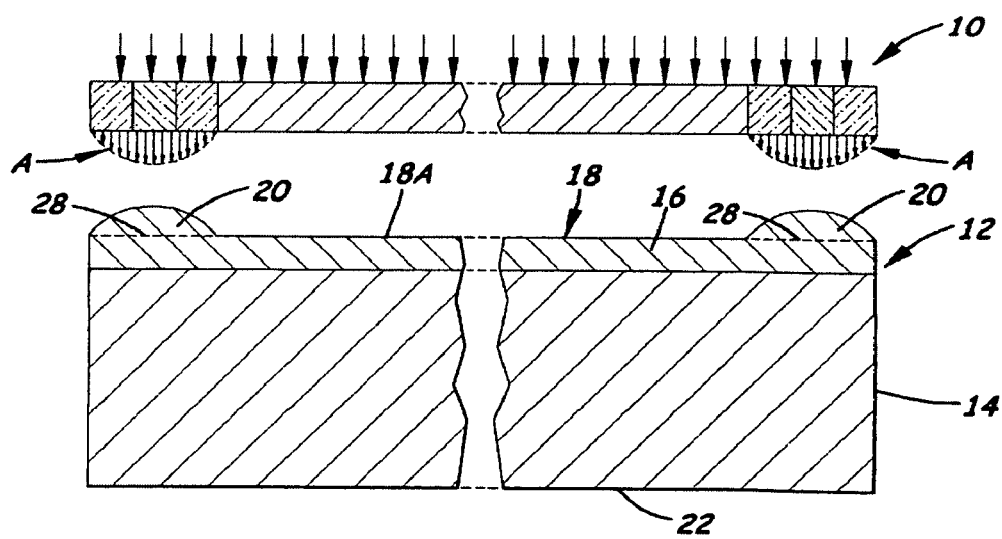
Figure 4:
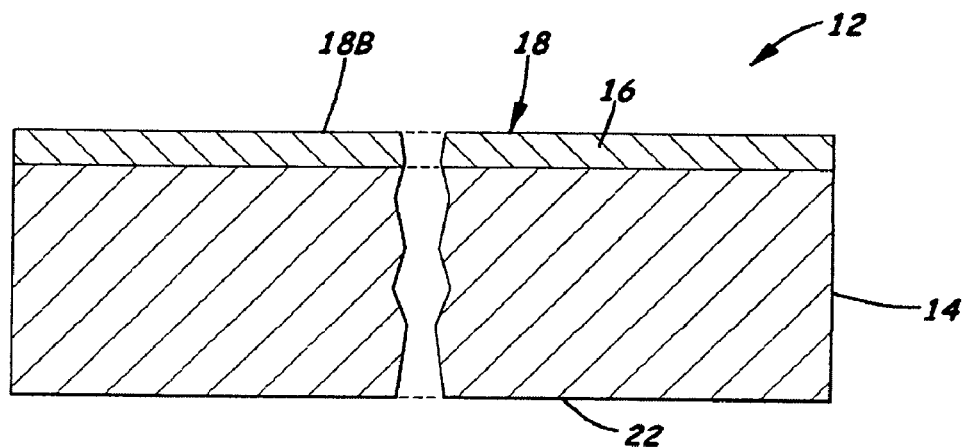

FIGS. 3 and 4 are schematic sectional representations of successive stages in the method of the present invention of using the gray-scale mask to planarize the surface of the photoresist layer on a substrate of a wafer.

Figure 5:
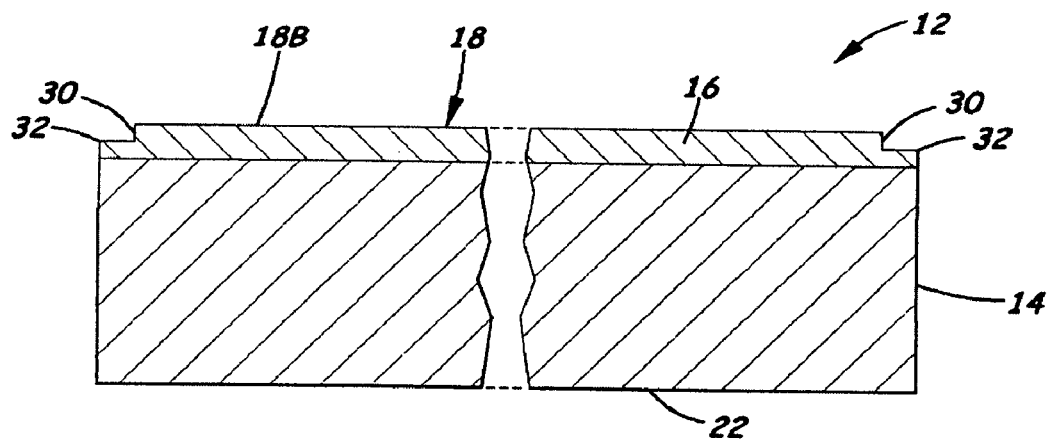

FIG. 5 is a schematic side representation of the wafer having an additional process step applied to the photoresist layer to produce a negative stepped recess in an outer edge thereof which extends about the wafer.

DETAILED DESCRIPTION

The present invention now will be described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements. Like numerals refer to like elements throughout the views.

As mentioned earlier, in a typical application as used heretofore, the gray-scale lithography technique is employed in combination with a DRIE technique. This prior art combination is disclosed in U.S. Pat. No. 5,310,623 to Gal, International patent application publication WO 02/31600 (also PCT/US01/426290 to Whitney et al., and an article entitled "Microfabrication of 3D silicon MEMS structures using gray-scale lithography and deep reactive ion etching" by C. M. Waits et al. *Sensors and Actuators A* 119 (2005) p. 245-253. Basically, in the typical application a gray-scale mask is designed with a pattern of light transmission through it that correlates to the profile of a desired three-dimensional structure to be formed in a silicon substrate. The gray-scale mask is positioned over a photoresist layer on the substrate and light of a given wavelength, such as UV light, is transmitted through the mask so as to expose the gray-scale mask pattern on the photoresist layer making the exposed three-dimensional portion thereof either soluble or insoluble in a developer (that will be next applied to the photoresist layer) depending upon whether the photoresist material is positive or negative. Assuming, for example, that the photoresist layer is a positive photoresist, the developer will then dissolve and remove all portions of the photoresist exposed to the UV light leaving a photomask in the photoresist layer that is a replica of the three-dimensional structure patterned by the gray-scale mask just employed originally to expose the layer. The photomask in the photoresist layer and portions of the silicon substrate therewith are then etched by the application of the DRIE technique thereto so as to transfer the profile of the three-dimensional structure, as represented by the photomask of the photoresist layer, into the silicon substrate.

Referring now to FIGS. 1 and 1A, there is illustrated a gray-scale mask, generally designated 10, which is employed in the method of the present invention to planarize unevenness of a wafer 12, as shown in FIG. 2. More particularly, the method of the present invention, depicted in FIGS. 3 and 4, utilizes the gray-scale mask 10 to planarize or flatten the unevenness of a surface of a photoresist layer on a substrate 14 of the wafer 12 seen in FIG. 2. More particularly, in the exemplary embodiment disclosed herein and illustrated in FIG. 2, the photoresist layer is an etch stop layer 16 and the surface in question is a back surface 18 on the etch stop layer 16. The unevenness of the back surface 18 is due to the presence of a peripheral edge bead 20 thereon which protrudes outwardly from the back surface 18, as readily apparent in FIG. 2. The back surface 18 of the etch stop layer 16 is the one which faces an electrostatic chuck (not shown) that is used to hold the wafer 12 during Deep Reactive Ion Etching (DRIE) and other wafer processing steps applied to the front surface of the substrate 14 of the wafer 12. Examples of DRIE systems using electrostatic chucks are disclosed in the U.S. patent application cross-referenced above, U.S. patent application publication no. 2007/0004215 to Mrvos et al., and U.S. Pat. No. 7,271,104 to Bernard et al., the disclosure of which is hereby incorporated herein by reference.

It should be clearly understood by now that in the method of the present invention, as depicted in FIGS. 3 and 4, DRIE processing steps are not applied to the back surface 18 of the etch stop layer 16 from which the peripheral edge bead 20 is removed by planarizing the back surface 18, using solely the gray-scale lithography technique. Thus, there is no transfer of a three-dimensional structure patterned by the gray-scale mask into the wafer via the back surface. Instead, as mentioned above, the DRIE processing steps are typically applied to the opposite, or front, surface 22 of the substrate 14 of the wafer 12. Thus, although the technique of gray-scale lithography and the general design and fabrication of a gray-scale mask as used herein are known heretofore per se, as evidenced in the publications cited above, it has not been known heretofore to employ a gray-scale mask 10 as in the method of the present invention in which it is utilized in planarizing or flattening the unevenness of any surface and, particularly, the back surface 18 of the photoresist etch stop layer 16 on the substrate 14 of the wafer 12 which results in the removal of the peripheral edge bead 20 from the surface 18 of the etch stop layer 16.

In gray-scale lithography, the gray-scale mask 10 typically has more than two optical densities. In many cases, it has multiple discreet "gray-levels" arranged in a desired pattern or profile to locally modulate or manipulate the intensity of light of a predetermined wavelength, usually ultraviolet (UV) light, that is used in the standard photoresist exposure process. In the traditional lithographical process, the mask has only two types of optical densities, an opaque "dark field" and a transparent "clear field", resulting in two-dimensional features with relatively straight sidewalls in the photoresist. In the gray-scale lithography, the mask 10 is constructed with a plurality of precisely located and sized openings 24 that transmit light of the predetermined varying intensities. The openings 24 are formed with sufficiently small specific opening sizes and are located at a sufficiently large number of specific locations, as symbolically represented by the interconnected boxes 26 in FIG. 1A, which correlate to related locations on the desired object, to pattern the UV light by passage through the openings 24 of the mask. In those locations 26 of the mask 10 having no openings, such being symbolically designated by a "x" in the boxes for those particular openings, there will be zero transmission of light intensity through those locations in the mask 10. In other of the locations 26 of the mask 10 having progressively larger openings 24, as symbolically represented by the varying lengths of the arrows A in FIG. 1A, there will be progressively greater transmissions of light intensity through those locations in the gray-scale mask 10.

Another way to design the gray-scale mask 10 is that described in U.S. Pat. No. 6,635,412 to Afromowitz. The gray-scale mask 10 is designed to permit varying doses of UV light to penetrate the mask 10 and illuminate the photoresist layer 16. The gray-scale mask 10 is one in which its different areas contain different UV light transmission fractions; or it may be a mask having very small low UV transmission dots of varying sizes or dot densities, selectively placed in regions of otherwise high UV light transmission. Regions of the positive photoresist layer exposed to a high enough dose of UV light will soften throughout the greater depths of the photoresist layer penetrated by the UV light, as described above. Regions of photoresist exposed to lesser doses will soften from the exposed free surface to lesser depths, depending on the UV light dose. Upon development, the positive photoresist remaining on the substrate will exhibit variations in thickness, corresponding to the variations in UV doses that the mask allowed to penetrate to the photoresist layer. In the particular embodiment herein, this pattern of varying thickness of the positive photoresist is equivalent to the profile of the peripheral edge bead 20 on the surface 18 of the layer 16.

Measurements are taken of the dimensions of the actual edge bead 20 to determine its nominal profile and then the measurements are correlated with a pattern that is then fabricated in the mask 10. There are several known means to make such measurements, but most simply and effectively they can be made by using a conventional profilometer. Other means could be cross-sectioning and measuring profiles visually. This measurement operation is part of a normal process control regime well-known to one of ordinary skill in the art and so need not be described in detail herein.

Referring now to FIGS. 3 and 4, there is illustrated successive stages in the method of using the gray-scale mask 10 to substantially planarize the back surface 18 of the photoresist etch stop layer 16 on the substrate 14 of the wafer 12. FIG. 3 shows the gray-scale mask 10 positioned over the back surface 18 of the photoresist etch stop layer 16. The back surface 18 with its unevenness due to the presence of the peripheral edge bead 20 is referred to as a starting surface 18A on the photoresist layer 14 in the context of the method of the present invention. The gray-scale mask 10 has a pattern of the holes 24 at locations 26 therein, as represented in FIG. 1A, which transmits a profile of light of varying intensities through it, as represented by the varying lengths of the arrows A, that correlates with a gradient height profile of unevenness on the starting surface 18A which is the profile of the peripheral edge bead 20 present thereon. FIG. 3 also shows the photoresist etch stop layer 16 patterned by the varying intensity of the light transmitted by gray-scale mask 10 and incident upon the starting surface 18A of the layer 16 which after a predetermined duration of time produces the pattern of the gray-scale mask 10 in the photoresist layer 16, in effect, as a patterned profile of evenness, as represented by the dashed line 28 in FIG. 3, in the photoresist etch stop layer 16 underlying the gradient height profile of unevenness or the peripheral edge bead 20. This means that all of the portion of the photoresist etch stop layer 16 lying above the dashed line 28, which constitutes the peripheral edge bead 20, has been made soluble in the developer solution used in the next following stage of the method of the present invention.

FIG. 4 shows the substrate 14 of the wafer 12 with the patterned photoresist etch stop layer 14 thereon after it has been developed. The portion of the photoresist layer 16, that being the peripheral edge bead 20 which corresponds to the gradient height profile of unevenness, located above the patterned profile of evenness, as represented by the dashed line 28, are the exposed portions of the photoresist layer 16. They are developed by rinsing the photoresist layer 16 in a suitable developing solution. The portion of the positive photoresist layer 16 above the dashed line 28 is developed by its exposure to the UV light. The UV-exposed and developed regions dissolve in the developer and wash away, leaving the resulting surface 18B on the photoresist layer having the profile of evenness as represented by the dashed line 28. This, in effect, leaves behind the resulting surface 18B on the photoresist etch stop layer 16 substantially without the presence of the peripheral edge bead thereon and thereby made substantially more even and thus substantially in a planarized condition. Thus, the image or profile 28 of evenness is produced by exposing the photoresist layer 16 to light of a selected or predetermined wavelength through the gray-scale mask 10, transmitted through the mask 10 for a selected duration of time. The light is usually ultraviolet (UV) light.

Turning to FIG. 5, there is illustrated the results of patterning the photoresist layer by overexposing a marginal edge portion thereof to the light so as to create an uniform, though negative, step 30 into the resulting surface 18B and an outer edge 32 on the photoresist etch stop layer 16 extending around the wafer 12. Given that the edge bead width is at most 2000 µm, a negative step of ~1-10 microns would ensure a positive wafer clamp to the ESC, would not interfere with the He BSG circuit, and still be thick enough to protect the underside of the wafer from the etch.

The foregoing description of several embodiments of the invention has been presented for purposes of illustration. It is not intended to be exhaustive or to limit the invention to the precise forms disclosed, and obviously many modifications and variations are possible in light of the above teaching. It is intended that the scope of the invention be defined by the claims appended hereto.

What is claimed is:

1. A method for planarizing a surface of a photoresist layer on a substrate of a wafer, comprising:
   positioning over a starting surface of the photoresist layer a gray-scale mask having a pattern that correlates with a gradient height profile of unevenness present on the starting surface;
   patterning the photoresist layer by using the gray-scale mask to produce the pattern of the gray-scale mask in the photoresist layer which, in effect, produces a patterned profile of evenness in the photoresist layer underlying the gradient height profile of unevenness;
   and developing the patterned photoresist layer such that a three-dimensional portion thereof corresponding to the gradient height profile of unevenness located above the patterned profile of evenness is removed which, in effect, leaves behind a resulting surface of the photoresist layer made substantially more even and thus substantially in a planarized condition, said patterning further including overexposing a marginal edge portion of the photoresist layer to create a negative step into the resulting surface and an outer edge on the photoresist layer extending around the wafer.

2. The method of claim 1 wherein said patterning produces the patterned profile of evenness in the photoresist layer by exposing the photoresist layer with a predetermined light that is modulated in intensity as it passes through the pattern of the gray-scale mask.

3. The method of claim 2 wherein said exposing the photoresist layer with the predetermined light renders it susceptible to the subsequent developing thereof by the predetermined light penetrating the photoresist layer to variable depths in the photoresist layer correlated with the modulated intensity of the light, from the starting surface thereon, as defined by the gradient height profile of unevenness correlated with the pattern of the gray-scale mask, to the patterned profile of evenness produced in the photoresist layer by the modulated intensity of the light passing through the gray-scale mask.

4. The method of claim 1 wherein said patterning includes transmitting predetermined light through the pattern of the gray-scale mask to thereby control the intensity of the light penetrating the photoresist layer and thereby the variable depths in the photoresist layer.

5. The method of claim 4 wherein said patterning further includes controlling the duration of time that the light is transmitted through the pattern of the gray-scale mask.

6. A method for removing a peripheral edge bead on a surface of a photoresist layer on a substrate of a wafer, comprising:
   positioning over a starting surface of the photoresist layer having the peripheral edge bead present thereon a gray-scale mask having a profile that correlates with a gradient height profile of unevenness on the starting surface due to the presence of the peripheral edge bead thereon;
   patterning the photoresist layer by using the gray-scale mask to produce the pattern of the gray-scale mask in the photoresist layer which, in effect, produces a patterned profile of evenness in the photoresist layer underlying the gradient height profile of unevenness;
   and developing the patterned photoresist layer such that the peripheral edge bead corresponding to the gradient height profile of unevenness located above the patterned profile of evenness is removed which, in effect, leaves behind a resulting surface on the photoresist layer substantially without the presence of the peripheral edge bead thereon and thereby made substantially more even and thus substantially in a planarized condition. said patterning further including overexposing a marginal edge portion of the photoresist layer to create a negative step into the resulting surface and an outer edge on the photoresist layer extending around the wafer.

7. The method of claim 6 wherein said patterning produces the patterned profile of evenness in the photoresist layer by exposing the photoresist layer with a predetermined light that is modulated in intensity as it passes through the gray-scale mask.

8. The method of claim 7 wherein said exposing the photoresist layer with the predetermined light renders it susceptible to the subsequent developing thereof due to the predetermined light penetrating the photoresist layer to variable depths in the photoresist layer from the starting surface thereon, as defined by the gradient height profile of unevenness correlated with the pattern of the gray-scale mask and thereby, to the patterned profile of evenness produced in the photoresist layer by the gray-scale mask.

9. The method of claim 8 wherein said patterning also includes transmitting the predetermined light through the pattern of the gray-scale mask to thereby control the intensity of the predetermined light penetrating the photoresist layer and thereby the variable depths in the photoresist layer.

10. The method of claim 9 wherein said patterning further includes controlling the duration of time that the predetermined light is transmitted through the pattern of the gray-scale mask.

* * * * *